United States Patent
Hou

(10) Patent No.: US 8,410,571 B2
(45) Date of Patent: Apr. 2, 2013

(54) LAYOUT OF DUMMY PATTERNS

(75) Inventor: Hsin-Ming Hou, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 424 days.

(21) Appl. No.: 12/211,828

(22) Filed: Sep. 17, 2008

(65) Prior Publication Data

US 2009/0008803 A1 Jan. 8, 2009

Related U.S. Application Data

(63) Continuation-in-part of application No. 11/457,140, filed on Jul. 12, 2006, now Pat. No. 7,566,647.

(51) Int. Cl.
*H01L 31/00* (2006.01)
(52) U.S. Cl. .............. 257/459; 257/786; 257/E23.151
(58) Field of Classification Search .............. 257/459, 257/786
See application file for complete search history.

(56) References Cited

U.S. PATENT DOCUMENTS

| 6,054,362 | A | 4/2000 | Chuang | |
|---|---|---|---|---|
| 6,261,883 | B1* | 7/2001 | Koubuchi et al. | 438/197 |
| 6,287,948 | B1 | 9/2001 | Ushiyama | |
| 6,384,464 | B1* | 5/2002 | Shin | 257/503 |
| 6,414,393 | B2 | 7/2002 | Sumino et al. | |
| 2003/0034567 | A1* | 2/2003 | Sato et al. | 257/786 |
| 2004/0084777 | A1* | 5/2004 | Yamanoue et al. | 257/758 |
| 2007/0108628 | A1* | 5/2007 | Ozawa et al. | 257/778 |

* cited by examiner

*Primary Examiner* — Thien F Tran
(74) *Attorney, Agent, or Firm* — Winston Hsu; Scott Margo

(57) ABSTRACT

A layout of dummy patterns on a wafer having a plurality of pads disposed thereon is described. The layout of the dummy patterns includes having a plurality of dummy patterns spaced apart from each other and enclosing the plurality of the pads. The plurality of dummy patterns also include a plurality of peripheral dummy patterns and a plurality of central dummy patterns, wherein a minimum distance between the plurality of the central dummy patterns and the plurality of the pads is greater a minimum distance between the plurality of the peripheral dumpy patterns and the plurality of the pads.

20 Claims, 3 Drawing Sheets

LAYOUT OF DUMMY PATTERNS

CROSS-REFERENCE TO RELATED APPLICATION

This application is a continuation-in-part of a prior application Ser. No. 11/457,140, filed on Jul. 12, 2006. The entirety of the above-mentioned patent application is hereby incorporated by reference herein and made a part of this specification.

BACKGROUND OF THE INVENTION

1. Field of the Invention

The present invention relates to a layout of dummy patterns. More particularly, the present invention relates to a layout of dummy patterns in a pad layer.

2. Description of Related Art

Generally speaking, semiconductor process can be roughly classified into front end process and back end process, wherein front end process includes processes such as formation of substrate, the deposition of film layers, lithography, etching, ion implantation, and metallic interconnects, and back end process is packaging process. Solder pads are formed on the substrate of the semiconductor before entering back end process to be used as signal joints for transmitting circuit signals of the IC to external circuit.

Presently, aluminum, copper, or other alloys are used for manufacturing solder pad. Wherein, copper solder pad has such advantages as low resistance, good anti-electromigration performance, and is ideal for dealing with high device integration. However, copper solder pad is easily destroyed during testing since the hardness thereof is low, and moreover, copper can be easily oxidized, extruded, contaminated, or diffused since copper is very active, which may cause problems during the step of bonding, or require additional cleaning step. Thus, aluminum is usually used as the material of solder pad.

In the conventional technology, to form aluminum pads, an aluminum film layer is first formed and then the aluminum film layer is processed with plasma etching. The proportion of the aluminum pads to the entire aluminum film layer is between 3%~6%, that is, large amount of the plasma gas needs to be used for removing large areas of aluminum film. Because of the pattern density of the aluminum pad is low, and that the etching machine used in general process is usually designed to etch film of high pattern density, a problem of insufficient process window is occurred of during the etching process of the aluminum pad. Accordingly, the dissociative plasma gas assembles around the aluminum pad pattern, which results in the problem of aluminum erosion and low reliability of the device.

In particular, the material of the aluminum pads is usually aluminum copper alloy containing trace copper, the more aluminum film to be etched and removed, the higher the probability of copper separate out is, thus, defects on the wafer are increased.

SUMMARY OF THE INVENTION

Accordingly, the present invention is directed to a layout of dummy patterns in a pad layer, in which the problem of insufficient process window of the etching process and erosion to electrical connection pads is obviated.

According to another aspect of the present invention, a layout of dummy patterns between electrical connection pads is provided, in which the pattern density of the pad layer is increased.

According to the layout of dummy patterns of the invention, a plurality of dummy patterns is disposed over a wafer that comprises at least a plurality of pads thereon. Further, the plurality of the dummy patterns is spaced apart from each other and the plurality of the dummy patterns surrounds the plurality of the pads.

According to the foregoing layout of dummy patterns, the plurality of the dummy patterns is disposed at appropriate distances from the plurality of the pads; however, there is at least some of the plurality of the dummy patterns being disposed with a region at a periphery of at least one side of each pad, wherein the region extends from the one side of each pad to a distance of about the length of the one side of the pad.

According to an embodiment of the invention, some of the pads may be individually surrounded by some of the dummy patterns.

According to an embodiment of the invention, some of the dummy patterns are disposed between a sealing ring at peripheral edges of the wafer and some of the pads.

According to an embodiment of the invention, the plurality of the dummy patters further includes a plurality of peripheral dummy patterns and a plurality of central dummy patterns, wherein the minimum distance between the plurality of the central dummy patterns and the plurality of the pads is greater than the minimum distance between the plurality of the peripheral dummy patterns and the plurality of the pads.

According to an embodiment of the invention, any two of the immediate neighboring peripheral dummy patterns are spaced apart from each other at a distance of S2, while any two of the immediate neighboring central dummy patterns are spaced apart from each other at a distance of L2.

According to an embodiment of the invention, L2 is greater than S2.

According to the foregoing layout of dummy patterns, the plurality of the dummy patterns is arranged in rows and columns.

According to an embodiment of the invention, an extension direction of each row or each column of the dummy patterns is parallel to a side of at least one of the plurality of the pads.

According to an embodiment of the invention, the arrangement of the plurality of the peripheral dummy patterns may be same or different from the arrangement of the plurality of the central dummy patterns.

According to an embodiment of the invention, the plurality of the peripheral dummy patterns of each row or each column of the peripheral dummy patterns is aligned with the peripheral dummy patterns of the next row or the next column of the peripheral dummy patterns.

According to an embodiment of the invention, the plurality of the central dummy patterns of each row or each column of the central dummy patterns is not aligned with the peripheral dummy patterns of the next row or the next column of the peripheral dummy patterns.

According to an embodiment of the invention, the dummy patterns may have same or different shapes.

According to an embodiment of the invention, the top cross-section view of each dummy pattern is rectangular shape, more preferably, square shape.

According to an embodiment of the invention, the dummy patterns may have same size or different size.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
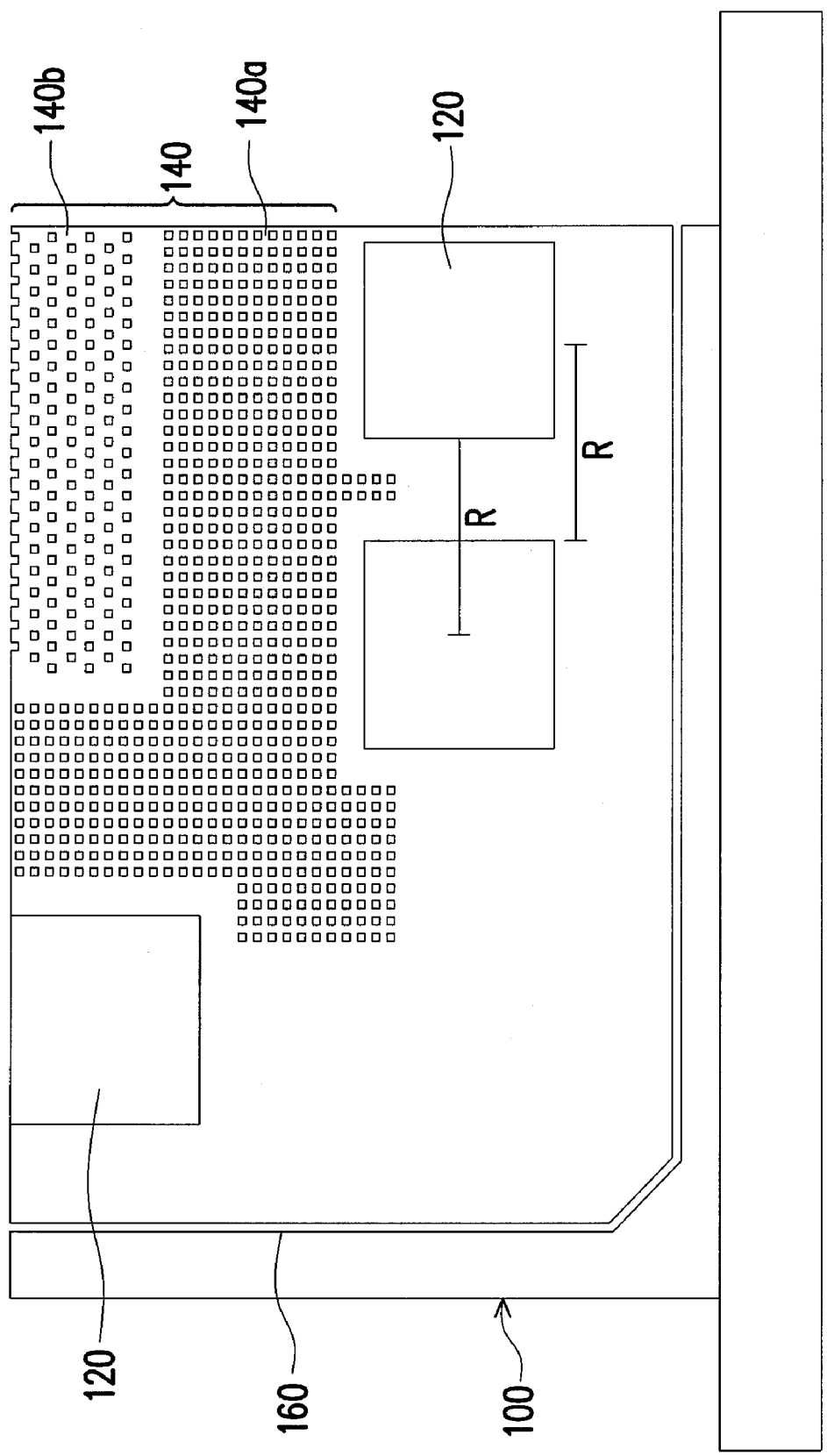
FIG. 1 is a top view illustrating a layout of a plurality of dummy patterns according to an embodiment of the present invention.

FIG. 1 is a top view illustrating a layout of a plurality of dummy patterns according to an embodiment of the present invention.

Referring to FIG. 1, a plurality of electrical connection pads, simply known as pads 120, is disposed on a wafer 100. A plurality of dummy patterns 140 is also configured on the wafer 100, wherein the plurality of the dummy patterns 140 is spaced apart from each other like dummy islands and the plurality of the dummy patterns 140 encloses the plurality of the pads 120.

The plurality of the dummy patterns 140 is formed by, for example, forming a pad material layer (not shown) over the wafer 100, and removing a portion of the pad material layer using a photoresist layer (not shown) as a mask to form a pad layer, which includes the plurality of the pads 120 and the plurality of the dummy patterns 140.

The pad material layer is constituted with, for example, pure aluminum, or aluminum bearing metals such as aluminum copper alloy with trace copper or aluminum silicon copper alloy. The removal of a part of the pad material layer includes, but not limited to, plasma etching, such as reactive ion etching. In an embodiment, the predetermined pattern density of an aluminum pad layer is compared to a known dark/clear ratio thereof based on an entire chip. For example, the known dark/clear ratio is 30%, then a plurality of dummy patterns should be formed in the spaces between the aluminum pads, between the aluminum pads and the routings, between the routings on the entire chip if the predetermined pattern density of the aluminum pad layer is smaller than 30%, so that the area to be etched and removed won't be too large, which may result in insufficient process window of the etching process and aluminum erosion. The method of disposing the dummy patterns is as described in the foregoing two embodiments so will not be described again.

Typically, the plurality of the dummy patterns 140 are configured at appropriate distances from the plurality of the pads 120; however, according to the present invention, there is at least some of the plurality of the dummy patterns 140 being disposed within a region "R" at the periphery of at least one side of each pad 120. The region "R" extends from the one side of each pad 120 to a distance of about the length of the one side of each pad 120 of the plurality of the pads 120.

Figure 3:
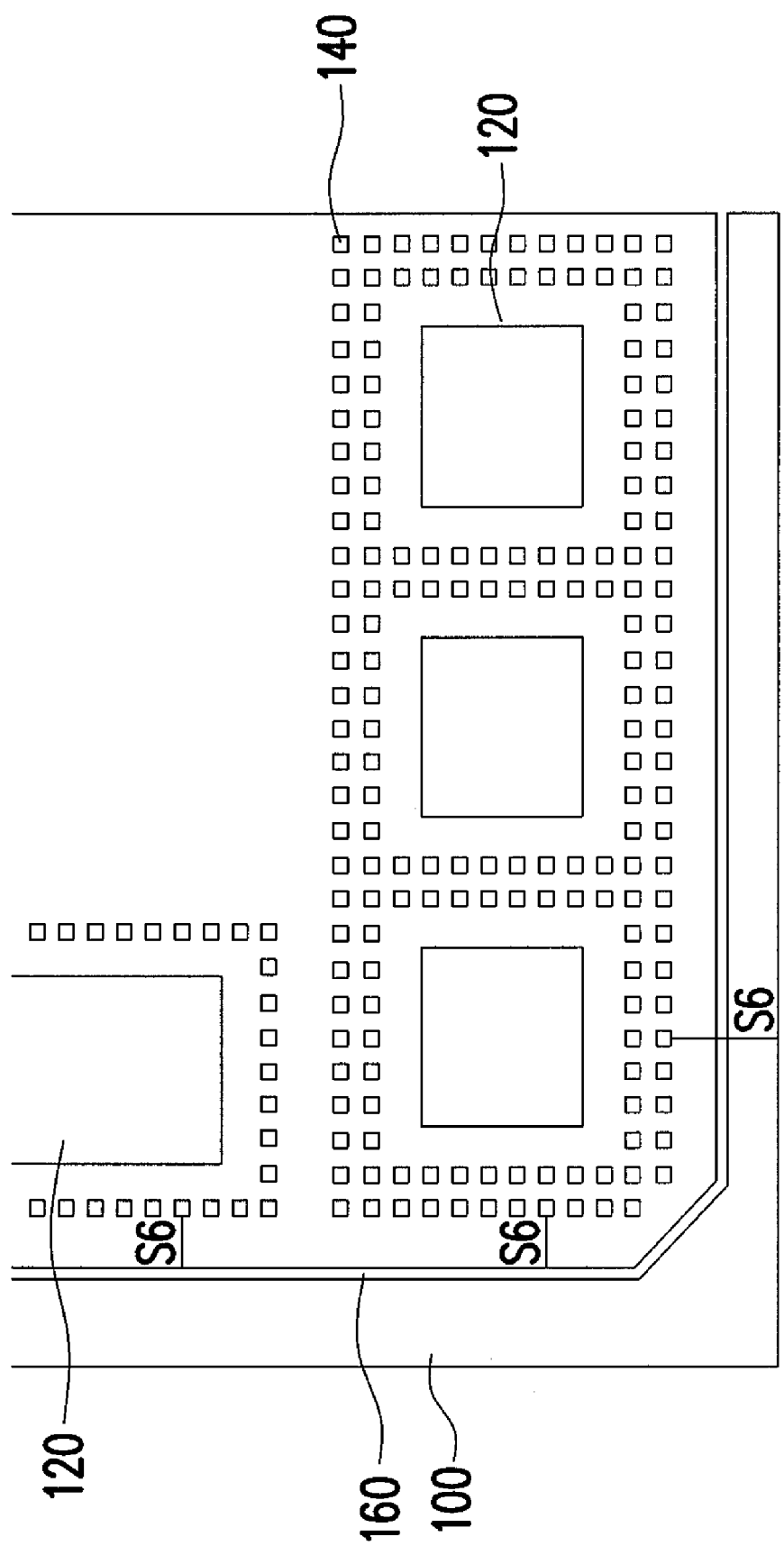
FIG. 3 is a top view illustrating a layout of a plurality of dummy patterns according to an embodiment of the present invention.

In one embodiment of the invention, some of the plurality of the pads 120 may be individually surrounded by some of the plurality of the dummy patterns 140 as shown in FIG. 3.

Moreover, when a seal ring 160 is configured at peripheral edges of the wafer 100, some of the dummy patterns 140 may be disposed between some of the pads 120 and the seal ring 160 as shown in FIG. 3. It is worthy to note that a minimum distance S6 is maintained between the dummy patterns 140 and the peripherals edge of the wafer 100. In one example, S6 is between 60 to 70 microns, preferably about 64 to 65 microns.

Figure 2:
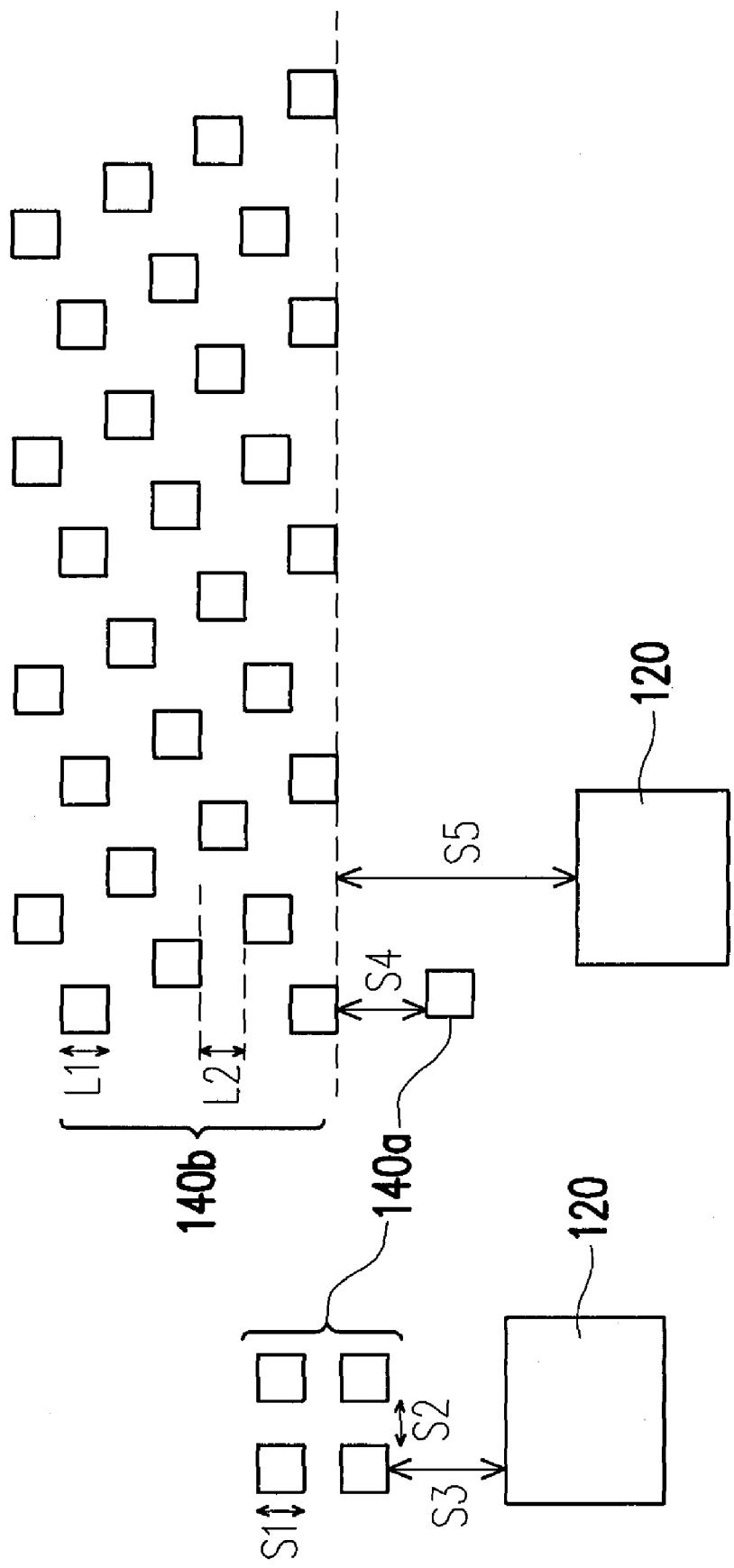
FIG. 2 is a top view illustrating a layout of a plurality of dummy patterns according to an embodiment of the present invention.

In accordance to an embodiment of the invention, the plurality of the dummy patterns 140 may include a plurality of peripheral dummy patterns 140a and a plurality of central dummy patterns 140b. As shown in FIGS. 1 and 2, the plurality of the peripheral dummy patterns 140a is disposed at a minimum distance S4 from the plurality of the central dummy patterns 140b, wherein S4 may be between 8 to 10 microns, for example 9 microns. Further, the plurality of the central dummy patterns 140b is configured closer to the central region of a wafer, comparing to the plurality of the peripheral dummy patterns 140a. In other words, when a minimum distance between the plurality of the central dummy patterns 140b and the plurality of the pads 120 is about S5 and a minimum distance between the plurality of the peripheral dummy patterns 140a and the plurality of the pads 120 is about S3, S5 is greater than S3. In one embodiment, S5 is between about 50 to 60 microns, for example, 56 microns; while S3 is between about 7-9 microns, for example, 8 microns.

Moreover, the plurality of the dummy patterns 140 is spaced apart from each other in a manner that there is a minimum distance L2 between any two immediate neighboring central dummy patterns 140b and a minimum distance S2 between any two immediate neighboring peripheral dummy patterns 104a, wherein L2 may be or may not be equal to S2. In one embodiment of the invention, L2 is greater than S2.

In accordance to an embodiment of the invention, the plurality of the dummy patterns 140 is arranged in rows and columns such that an extension direction of each row or each column of the dummy patterns 140 is parallel to a side of at least one of the plurality of the pads 120.

Further, as shown in FIG. 2, the plurality of the peripheral dummy patterns 140a of a row or a column of the peripheral dummy patterns 140a, for example, is aligned with the peripheral dummy patterns 140a of the next row or the next column of the peripheral dummy patterns 140a. On the other hands, the plurality of the central dummy patterns 140b of a row or a column of the central dummy patterns 140b may or may not aligned with the central dummy patterns 140b of the next row or the next column of the central dummy patterns 140b. In one embodiment of the invention, the plurality of the central dummy patterns 140b of a row or a column of the central dummy patterns 140b is disposed alternately with respect to the plurality of the central dummy patterns 140b of the next row or the next column of the central dummy patterns 140b.

As shown in FIG. 2, the top cross-sectional view of each dummy pattern 140 is rectangular shape, preferably square shape. The top cross-sectional view of the dummy patterns 140, however, may also be other geometric shapes. Similarly, the top cross-sectional view of the pads 120 is rectangular or square shape. In this embodiment of the invention, the plurality of the dummy patterns may have the same shape. Alternatively, the plurality of the dummy patterns may have different shapes.

Moreover, the plurality of the dummy patterns 140 may have same or different sizes. In one embodiment of the invention, the length of any one side of each of the plurality of the dummy patterns 140 is about 1 to 3 microns, for example 2 microns. Further, a length of any one side of each of the plurality of the dummy patterns 140 is about $1/10$ of a length of the shortest side of each of the plurality of the pads 120. More preferably, a length of any one side of each of the plurality of the dummy patterns is about 1/30 of a length of the shortest side of each of the plurality of the pads 120.

In summary, according to the layout of dummy patterns in the present invention, dummy patterns are arranged with respect to the pads in a manner so as to mitigate the problem of insufficient process window of the etching process and erosion of the pads, and further to improve the reliability of the device.

Moreover, in the present invention, the layout of dummy patterns can further increase the entire uniformity of the pad layer to improve the performance of the device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A layout of a plurality of dummy patterns disposed over a wafer that comprises at least a plurality of pads thereon, the plurality of the dummy patterns being spaced apart from each other, and surrounding the plurality of the pads, wherein the dummy patterns are of the same material as the pads and the dummy patterns are formed with a smaller size than the pads and a seal ring is configured at peripheral edges of the wafer, and some of the plurality of the dummy patterns is disposed between the seal ring and the plurality of the pads and a pattern density which is the percentage of area occupied by the plurality of pads and the plurality of dummy patterns with respect to the overall area of a pad material layer formed over the wafer constituted with aluminum or aluminum bearing metals is about 30%.

2. The layout of the plurality of the dummy patterns as claimed in claim 1, wherein a length of any one side of each of the plurality of the dummy patterns is about 1/10 of a length of a shortest side of each of the plurality of the pads.

3. The layout of the plurality of the dummy patterns as claimed in claim 1, wherein a length of any one side of each of the plurality of the dummy patterns is about 1/30 of a length of a shortest side of each of the plurality of the pads.

4. The layout of the plurality of the dummy patterns as claimed in claim 1, wherein at least some of the plurality of the dummy patterns is disposed within a region configured at a periphery of at least one side of each of the plurality of the pads, and the region extends from the at least one side of the each of the plurality of the pads to a distance of about a length of the at least one side of the each of the plurality of the pads.

5. The layout of the plurality of the dummy patterns as claimed in claim 1, wherein some of the plurality of the pads is individually surrounded by some of the plurality of the dummy patterns.

6. The layout of the plurality of the dummy patterns of claim 1, wherein the plurality of the dummy patterns is arranged in rows and columns such that an extension direction of each row or each column of the plurality of the dummy patterns is parallel to a side of at least one of the plurality of the pads.

7. The layout of the plurality of the dummy patterns of claim 6, wherein the plurality of the dummy patterns comprises a plurality of central dummy patterns and a plurality of peripheral dummy patterns.

8. The layout of the plurality of the dummy patterns of claim 7, wherein the plurality of the peripheral dummy patterns of each of the rows or each of the columns of the plurality of the peripheral dummy patterns is aligned with the plurality of the peripheral dummy patterns of the next row or the next column of the plurality of the peripheral dummy patterns.

9. The layout of the plurality of the dummy patterns of claim 7, wherein the plurality of the central dummy patterns of one of the rows or one of the columns of the central dummy patterns is disposed alternately with respect to the plurality of the central dummy patterns of the next rows or the next columns of the plurality of the central dummy patterns.

10. The layout of the plurality of the dummy patterns as claimed in claim 1, wherein the plurality of the dummy patterns is distributed at appropriate distances from the plurality of the pads, and a minimum distance between the plurality of the central dummy patterns and the plurality of the pads is greater a minimum distance between the plurality of the peripheral dumpy patterns and the plurality of the pads.

11. The layout of the plurality of the dummy patterns as claimed in claim 1, wherein a minimum distance $L2$ is maintained between any two of the immediate neighboring central dummy patterns of the plurality of the central dummy patterns and a minimum distance $S2$ is maintained between any two of the immediate neighboring peripheral dummy patterns.

12. The layout of the plurality of the dummy patterns as claimed in claim 11, wherein $L2$ is greater than $S2$.

13. The layout of the plurality of the dummy patterns as claimed in claim 1, wherein the plurality of the dummy patterns is rectangular shape.

14. The layout of the plurality of the dummy patterns as claimed in claim 1, wherein the plurality of the dummy patterns is square shape.

15. The layout of the plurality of the dummy patterns as claimed in claim 1, wherein the plurality of the dummy patterns has different shapes.

16. The layout of the plurality of the dummy patterns as claimed in claim 1, wherein the plurality of the dummy patterns has the same shape.

17. The layout of the plurality of the dummy patterns as claimed in claim 1, wherein the plurality of the dummy patterns has different sizes.

18. The layout of the plurality of the dummy patterns as claimed in claim 1, wherein a length of any one side of each of the plurality of the dummy patterns is about 1-3 microns.

19. The layout of the plurality of the dummy patterns as claimed in claim 1, wherein a material of the plurality of the pads comprises aluminum, aluminum copper alloy, or aluminum silicon copper alloy.

20. A layout of a plurality of dummy patterns disposed over a wafer that comprises at least a plurality of pads thereon, the plurality of the dummy patterns being spaced apart from each other and surrounding the plurality of the pads, wherein a minimum distance $S6$ is maintained between the dummy patterns and a peripheral edge of the wafer, a plurality of peripheral dummy patterns is disposed at a minimum distance $S4$ from a plurality of central dummy patterns, a minimum distance $S5$ is maintained between a plurality of the central dummy patterns and a plurality of the pads, a minimum distance $L2$ is maintained between any two immediate neighboring central dummy patterns, a minimum distance $S2$ is maintained between any two immediate neighboring peripheral dummy patterns and a minimum distance $S3$ is maintained between a plurality of the peripheral dummy patterns and a plurality of the pads.

* * * * *